(12) United States Patent
Kirner et al.

(10) Patent No.: US 9,929,364 B2
(45) Date of Patent: Mar. 27, 2018

(54) SOLUBLE CYCLIC IMIDES CONTAINING POLYMERS AS DIELECTRICS IN ORGANIC ELECTRONIC APPLICATIONS

(71) Applicant: BASF SE, Ludwigshafen (DE)

(72) Inventors: Hans Jürg Kirner, Basel (CH);
Emmanuel Martin, Folgensbourg (FR);
Patrice Bujard, Courtepin (CH);
Jean-Charles Flores, Mulhouse (FR);
Jordan Thomas Kopping, Weinheim (DE)

(73) Assignee: BASF SE, Ludwigshafen (DE)

( * ) Notice: Subject to any disclaimer, the term of this patent is extended or adjusted under 35 U.S.C. 154(b) by 125 days.

(21) Appl. No.: 14/888,574

(22) PCT Filed: Apr. 29, 2014

(86) PCT No.: PCT/EP2014/058667
§ 371 (c)(1),
(2) Date: Nov. 2, 2015

(87) PCT Pub. No.: WO2014/180704
PCT Pub. Date: Nov. 13, 2014

(65) Prior Publication Data
US 2016/0087230 A1    Mar. 24, 2016

(30) Foreign Application Priority Data

May 6, 2013  (EP) .................................... 13166621
Sep. 4, 2013  (EP) .................................... 13182921

(51) Int. Cl.
| | | |
|---|---|---|
| H01L 51/05 | (2006.01) | |
| H01L 49/02 | (2006.01) | |
| C08F 232/04 | (2006.01) | |
| H01L 51/00 | (2006.01) | |

(52) U.S. Cl.
CPC .......... *H01L 51/052* (2013.01); *C08F 232/04* (2013.01); *H01L 28/40* (2013.01); *H01L 51/0035* (2013.01); *H01L 51/0036* (2013.01); *H01L 51/0043* (2013.01); *H01L 51/0541* (2013.01)

(58) Field of Classification Search
CPC .... C08F 232/04; H01L 28/40; H01L 51/0035; H01L 51/0036; H01L 51/0043; H01L 51/052; H01L 51/0541
USPC ....................................................... 526/262
See application file for complete search history.

(56) References Cited

U.S. PATENT DOCUMENTS

| | | | |
|---|---|---|---|
| 3,426,228 A * | 2/1969 | Torrance ................ | H01B 3/308 156/51 |
| 4,683,275 A | 7/1987 | Kato et al. | |
| 6,451,459 B1 | 9/2002 | Tieke et al. | |
| 7,005,674 B2 | 2/2006 | Lee et al. | |
| 7,256,419 B2 | 8/2007 | Jeong et al. | |
| 2005/0001210 A1* | 1/2005 | Lee ..................... | H01L 51/0545 257/40 |
| 2005/0127355 A1 | 6/2005 | Jeong et al. | |
| 2009/0206330 A1 | 8/2009 | Lee et al. | |
| 2010/0240813 A1* | 9/2010 | Terada .................. | C08G 65/44 524/133 |
| 2014/0299871 A1 | 10/2014 | Bujard et al. | |
| 2014/0332730 A1 | 11/2014 | Hayoz et al. | |
| 2015/0029638 A1 | 1/2015 | Kirner et al. | |
| 2015/0132887 A1 | 5/2015 | Welker et al. | |
| 2015/0318496 A1 | 11/2015 | Jiao et al. | |
| 2015/0333265 A1 | 11/2015 | Welker et al. | |

FOREIGN PATENT DOCUMENTS

| | | | |
|---|---|---|---|
| CN | 1577912 A | 2/2005 | |
| CN | 1637066 A | 7/2005 | |
| CN | 102070854 A | 5/2011 | |
| EP | 1459392 A1 | 9/2004 | |
| JP | 2013-019957 * | 1/2013 | ............... G02B 1/04 |
| WO | WO-03/052841 A1 | 6/2003 | |
| WO | WO-2005/049695 A1 | 6/2005 | |
| WO | WO-2008/000664 A1 | 1/2008 | |
| WO | WO-2010/049321 A1 | 5/2010 | |
| WO | WO-2010/049323 A1 | 5/2010 | |
| WO | WO-2010/108873 A1 | 9/2010 | |
| WO | WO-2010/115767 A1 | 10/2010 | |
| WO | WO-2010/136352 A1 | 12/2010 | |
| WO | WO-2010/136353 A1 | 12/2010 | |
| WO | WO-2012/059386 A1 | 5/2012 | |
| WO | WO-2013/144856 A1 | 10/2013 | |

OTHER PUBLICATIONS

International Search Report for PCT/EP2014/058667 dated Jun. 18, 2014.
Chinese Office Action for Chinese Application No. 201480025450.4, dated Jul. 3, 2017.

* cited by examiner

*Primary Examiner* — Ling Choi
*Assistant Examiner* — Chun-Cheng Wang
(74) *Attorney, Agent, or Firm* — Drinker Biddle & Reath LLP

(57) ABSTRACT

The present invention relates to an electronic device comprising a dielectric material, which dielectric material comprises a copolymer comprising styrene and maleimic acid and derivatives thereof as structural units, a process for the preparation of the electronic device and to the use of the copolymer as dielectric material, especially as dielectric layer in printed electronic devices such as capacitors and organic field-effect transistors.

16 Claims, 2 Drawing Sheets

SOLUBLE CYCLIC IMIDES CONTAINING POLYMERS AS DIELECTRICS IN ORGANIC ELECTRONIC APPLICATIONS

CROSS-REFERENCE TO RELATED APPLICATIONS

This application is a national stage application (under 35 U.S.C. § 371) of PCT/EP2014/058667, filed Apr. 29, 2014, which claims benefit of European Application Nos. 13166621.6, filed May 6, 2013, and 13182921.0, filed Sep. 4, 2013, all of which are incorporated herein by reference in their entirety.

TECHNICAL FIELD

The present invention relates to an electronic device, such as a capacitor or transistor, comprising a dielectric material based on styrene and maleimide or derivatives thereof as well as to a process for the preparation of such an electronic device, and their use.

BACKGROUND

Transistors, and in particular organic field effect transistors (OFETs), are used e.g. as components for printed electronic devices such as organic light emitting display, e-paper, liquid crystal display and radiofrequency identification tags. An OFET comprises a semiconducting layer comprising an organic semiconducting material, a dielectric layer comprising a dielectric material, a gate electrode and source/drain electrodes.

Especially desirable are OFETs wherein the dielectric material can be applied by solution processing techniques. Solution processing techniques are convenient from the point of processability, and can also be applied to plastic substrates. Thus, organic dielectric materials, which are compatible with solution processing techniques, such as spin coating, allow the production of low cost organic field effect transistors on flexible substrates.

EP 1 1 459 392 A discloses a process of manufacturing an organic field effect device comprising depositing an organic semiconductor layer from a solution, followed by depositing from a solution a layer of low permittivity insulating (i.e. dielectric) material forming at least a part of a gate insulator. The organic field effect device may further comprise a high permittivity insulating layer deposited on the other side of the low permittivity insulating layer. According to EP 1 1 459 392 A, the organic semiconductor layer may be a homopolymer or copolymer comprising the typical structural units arylamine, fluorene and thiophene. The semiconductor layer is coated on a substrate from an aromatic or chloroaromatic solvent such as toluene. The low permittivity insulating material of EP-A1 1 459 392 which may be based on polystyrene is preferably a fluoropolymer which is deposited on the organic semiconductor layer from a fluorosolvent which does not dissolve the semiconductors typically used in OFETs. The high permittivity insulating material may be also based on a fluoropolymer and is preferably deposited from a fluorosolvent.

WO 2012/059386 discloses a process for the preparation of a transistor on a substrate, the transistor comprising an insulating layer comprising a polyimide, wherein the polyimide is obtained by forming on the substrate a layer comprising a photocurable polyimide and further polymerizing the polyimide by irradiating with light of a wavelength of at most 360 nm. The photocurable polyimide is obtainable by reacting a dianhydride carrying at least one photosensitive group with a diamine carrying at least one crosslinkable group. The dianhydride carrying at least one photosensitive group may be a benzophenone derivative carrying two functionalities —C(O)—O—C(O)—. The diamine carrying at least one crosslinkable group may be an organic compound carrying two amino functionalities and at least one aromatic ring having attached thereto at least a $CH_2$ or a $CH_3$ group or at least on carbon-carbon double bond. For subsequent application to a substrate, a semiconductor layer is applied from an organic solvent such as toluene, and the insulating layer is applied from an organic solvent such as N-methyl-pyrrolidone, cyclopentanone, methyl ethyl ketone or ethyl acetate.

SUMMARY OF THE INVENTION

However, due to the limited solubility in so-called orthogonal solvents in solution processing, there is a need for dielectric materials which show a better solubility under these processing conditions. Further, low relative permittivity (epsilon)$_r$ is desired for such materials. Surprisingly, it was found that this object can be solved by specific copolymers as dielectric materials, which copolymers are based on structural units (I) and (II)

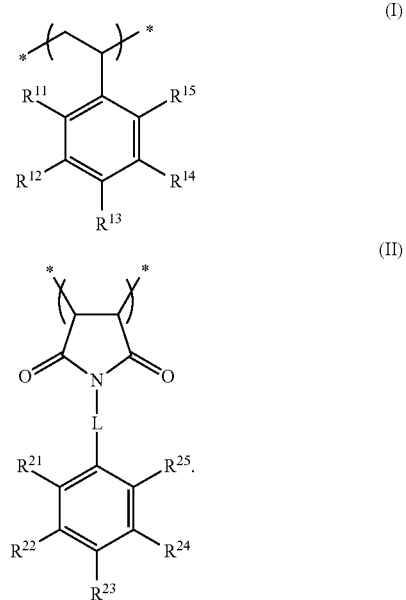

In particular, it has surprisingly been found that these dielectric materials comprising a copolymer comprising the structural units (I) and (II) have a surprisingly low permittivity and can be conveniently incorporated in electronic devices by solution processing techniques. Besides good solubility, the present dielectrics comprising the above polymers show high glass transition temperatures, which is advantageous for preventing deformation of the dielectric when subjected to subsequent processing steps (e.g. drying, typically performed at about 90-100° C.). Present dielectric polymers typically show glass transition temperatures above 130° C.-140° C. (i.e. higher than for conventional polystyrenes [consisting of structural units (I) only], which usually show a Tg up to 100-110° C.).

Therefore, the present invention relates to an electronic device comprising a dielectric material, which dielectric material comprises a copolymer comprising the structural units of formulae (I) and (II)

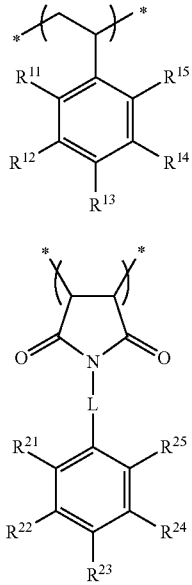

wherein $R^{11}$, $R^{12}$, $R^{13}$, $R^{14}$ and $R^{15}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H, and $R^{21}$, $R^{22}$, $R^{23}$, $R^{24}$ and $R^{25}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H, or wherein $R^{21}$ and $R^{22}$, or $R^{22}$ and $R^{23}$, form a cyclic structure with each other having from 5 to 8 C atoms, optionally interrupted by one or more oxygen atoms, —C(O)O—, —OC(O)—, sulfur atoms, —SO$_2$—, —NH—, —N(C$_{1-12}$ alkyl)- and/or —C(O)N(H)—, and $R^{23}$ and $R^{24}$ and $R^{25}$, or $R^{21}$ and $R^{24}$ and $R^{25}$, are as defined above, wherein L is a either a direct bond, or $C_{1-4}$ alkylene which is either uninterrupted or interrupted by one or more oxygen atoms, and wherein each R is independently H or $C_{1-24}$ alkyl.

Further, the present invention relates to a process for the preparation of an electronic device, said process comprising preparing a dielectric material comprising a copolymer comprising the structural units of formulae (I) and (II)

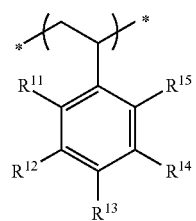

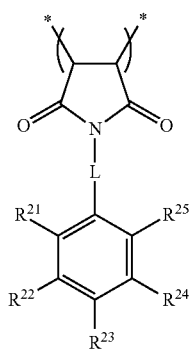

by
a) a free radical polymerization (typically solution based, or dispersion or suspension based) of at least monomer (Ia) and monomer (IIa);

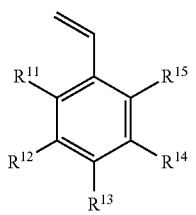

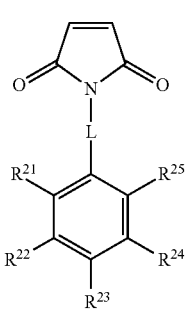

and/or
b) a controlled radical polymerization of at least monomer (Ia) and monomer (IIa); and/or
c) an imide forming reaction of a copolymer, comprising the structural unit (I), and the structural unit (IIb) and an amine compound (IIc)

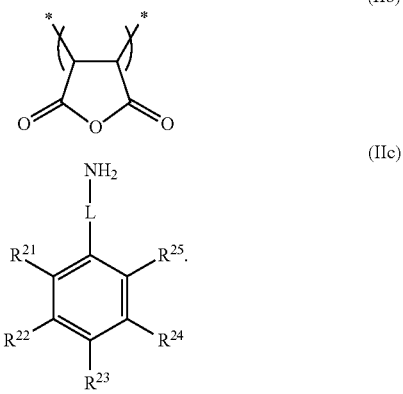

Yet further, the present invention relates to the use of a copolymer as defined above as a dielectric material, preferably as a dielectric layer in printed electronic devices such as capacitors and organic field-effect transistors.

BRIEF DESCRIPTION OF THE DRAWINGS

Analogously, FIGS. 3, 5 and 7 show the drain current $I_{ds}$ in relation to the gate voltage $V_{gs}$ (transfer curve) for the top-gate, bottom-contact (TGBC) field effect transistor comprising a copolymer (2b), (2c) or (2d), respectively, as the gate dielectric at a source voltage Vds of −1V (squares), and −20V (triangles); see Examples 6, 8 and 10 of the present invention.

Likewise, FIGS. 4, 6 and 8 show the drain current $I_{ds}$ in relation to the drain voltage Vds (output curve) for the top-gate, bottom-contact (TGBC) field effect transistor comprising copolymer (2b), (2c) or (2d), respectively, at a gate voltage $V_{gs}$ of 0 V (stars), −5 V (squares), −10 V (lozenges), −15 V (triangles) and −20 V (circles); see Examples 6, 8 and 10.

DETAILED DESCRIPTION

Figure 1:
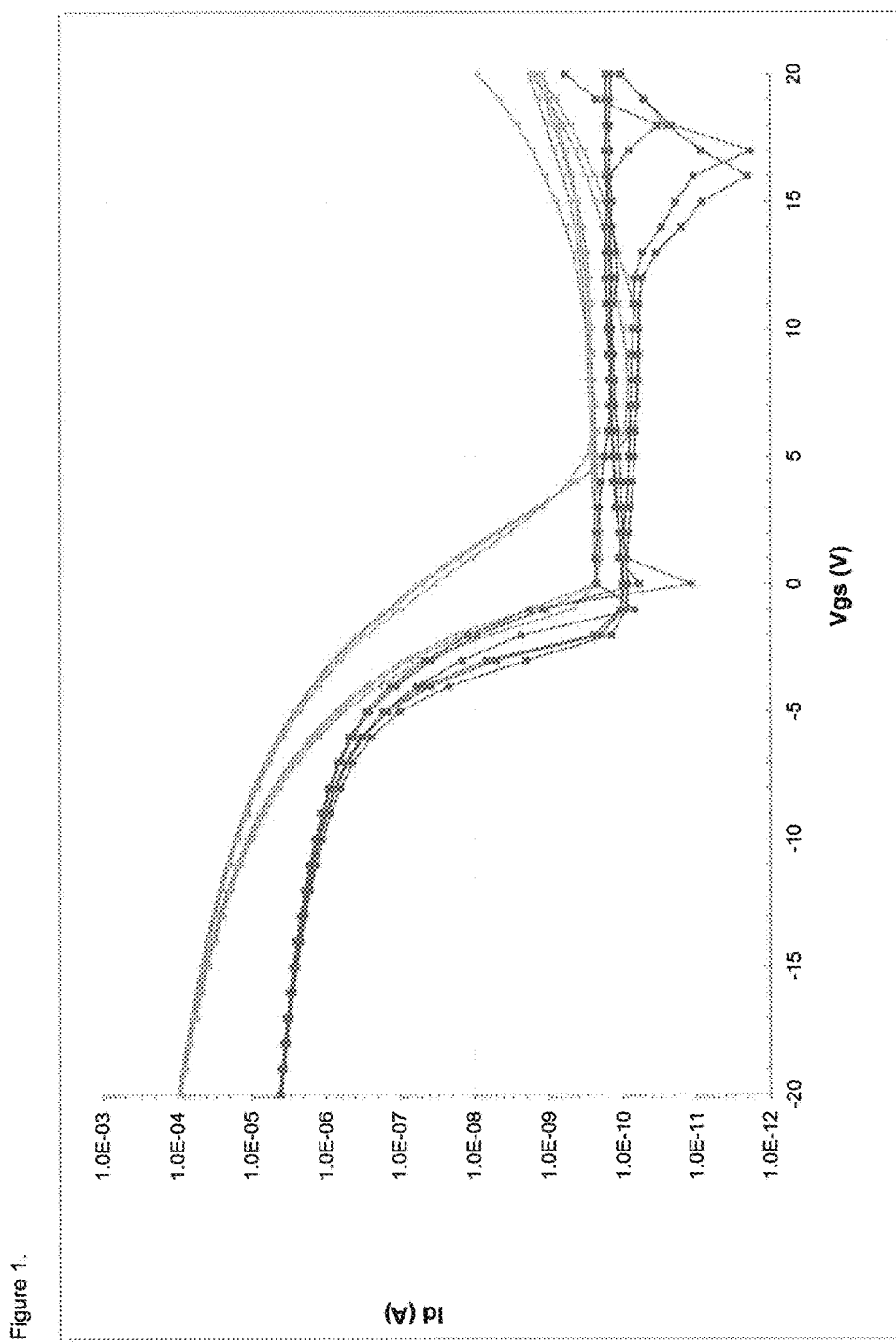
FIG. 1 shows the drain current $I_{ds}$ in relation to the gate voltage $V_{gs}$ (transfer curve) for a top-gate bottom-contact (TGBC) field effect transistor comprising copolymer (3a) gate dielectric at a source voltage $V_{ds}$ of −1 V (squares) and −20 V (triangles), respectively (see Example 4 of the present invention).

As described above, the present invention relates to an electronic device comprising a dielectric material, which dielectric material comprises a copolymer comprising the structural units of formulae (I) and (II).

Preferably, the device according to the present invention is a capacitor, a transistor such as an organic field effect transistor, or a device comprising said capacitor and/or said transistor.

The transistor is preferably a field-effect transistor (FET) and more preferably an organic field-effect transistor (OFET). Usually, an organic field effect transistor comprises a dielectric layer and a semiconducting layer. Further, an organic field effect transistor usually comprises a gate electrode and source/drain electrodes.

Typical designs of organic field effect transistors are the Bottom-Gate design and the Top-Gate design.

In case of a Bottom-Gate Top-Contact (BGTC) design, the gate is on top of the substrate and at the bottom of the dielectric layer, the semiconducting layer is at the top of the dielectric layer and the source/drain electrodes are on top of the semiconducting layer.

In case of a Top-Gate Bottom-Contact (TGBC) design, the source/drain electrodes are on top of the substrate and at the bottom of the semiconducting layer, the dielectric layer is on top of the semiconducting layer and the gate electrode is on top of the dielectric layer. When prepared by solution processing, the solvents used for dielectrics must be fully orthogonal with respect to the semiconductor. The term "fully orthogonal" as used herein relates to solvents which provide a good solubility regarding the dielectric and absolute insolubility regarding the semiconductor.

Generally, in the copolymers according to the present invention, the ratio of the structural units of formulae (I) and (II) may vary over a wide range. Preferably, the ratio of the structural units of formulae (I) and (II) is in the range of from 20:1 to 1:10, e.g. from 20:1 to 1:5; more preferably in the range of from 17:1 to 1:6, e.g. from 17:1 to 1:3; more preferably in the range of from 13:1 to 1:2, more preferably in the range of from 10:1 to 1:1.5. Conceivable ranges are, for example, from 10:1 to 8:1 or from 9:1 to 7:1 or from 8:1 to 6:1 of from 7:1 to 5:1 or from 6:1 to 4:1 or from 5:1 to 3:1 or from 4:1 or from 2:1 or from 3:1 to 1.5:1.

According to a conceivable embodiment of the present invention, $R^{11}$, $R^{12}$, $R^{13}$, $R^{14}$ and $R^{15}$ are, independently from each other, H, halogen, linear or branched $C_{1-20}$ alkyl, formyl. $C_{1-20}$ alkyl-carbonyl, $C_{2-20}$ alkenyl, $C_{2-8}$ alkynyl, $C_{2-20}$ alkenyl-carbonyl, $C_{3-8}$ cycloalkyl, $C_{3-8}$ cycloalkenyl, $C_{6-12}$ aryl, $C_{7-21}$ arylalkyl or $C_{7-21}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-10}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H.

According to a conceivable embodiment of the present invention, $R^{11}$, $R^{12}$, $R^{13}$, $R^{14}$ and $R^{15}$ are, independently from each other, H, halogen, linear or branched $C_{1-16}$ alkyl, formyl, $C_{1-16}$ alkyl-carbonyl, $C_{2-16}$ alkenyl, $C_{2-8}$ alkynyl, $C_{2-16}$ alkenyl-carbonyl, $C_{3-8}$ cycloalkyl, $C_{3-8}$ cycloalkenyl, $C_{6-12}$ aryl, $C_{7-17}$ arylalkyl or $C_{7-17}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-8}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H.

According to a conceivable embodiment of the present invention, $R^{21}$, $R^{22}$, $R^{23}$, $R^{24}$ and $R^{25}$ are, independently from each other, H, halogen, linear or branched $C_{1-20}$ alkyl, formyl, $C_{1-20}$ alkyl-carbonyl, $C_{2-20}$ alkenyl, $C_{2-8}$ alkynyl, $C_{2-20}$ alkenyl-carbonyl, $C_{3-8}$ cycloalkyl, $C_{3-8}$ cycloalkenyl, $C_{6-12}$ aryl, $C_{7-21}$ arylalkyl or $C_{7-21}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H.

According to a conceivable embodiment of the present invention, $R^{21}$, $R^{22}$, $R^{23}$, $R^{24}$ and $R^{25}$ are, independently from each other, $R^{21}$, $R^{22}$, $R^{23}$, $R^{24}$ and $R^{25}$ are, independently from each other, H, halogen, linear or branched $C_{1-16}$ alkyl, formyl, $C_{1-16}$ alkyl-carbonyl, $C_{2-16}$ alkenyl, $C_{2-8}$ alkynyl, $C_{2-16}$ alkenyl-carbonyl, $C_{3-8}$ cycloalkyl, $C_{3-8}$ cycloalkenyl, $C_{6-12}$ aryl, $C_{7-17}$ arylalkyl or $C_{7-17}$ alkylaryl, each of which carbon atom chains is either uninterrupted or interrupted by one or more oxygen atoms, —C(O)O—, —OC(O)—, —S—, —SO$_2$—, —N(H)—, —N($C_{1-8}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H.

According to a conceivable embodiment of the present invention, $R^{21}$ and $R^{22}$, or $R^{22}$ and $R^{23}$ form a cyclic structure with each other having from 5 to 8 C atoms, optionally interrupted by one or more oxygen atoms, —C(O)O—, —OC(O)—, sulfur atoms, —SO$_2$—, —NH—, —N($C_{1-10}$ alkyl)- and/or —C(O)N(H)—.

According to a conceivable embodiment of the present invention, $R^{21}$ and $R^{22}$, or $R^{22}$ and $R^{23}$ form a cyclic structure with each other having from 5 to 8 C atoms, optionally interrupted by one or more oxygen atoms, —C(O)O—, —OC(O)—, sulfur atoms, —SO$_2$—, —NH—, —N($C_{1-8}$ alkyl)- and/or —C(O)N(H)—.

According to a conceivable embodiment of the present invention, L is a either a direct bond, or $C_{1-4}$ alkylene, or $C_{1-3}$ alkylene, or $C_{1-2}$ alkylene, which alkylene is either uninterrupted or interrupted by one or more oxygen atoms.

According to a conceivable embodiment of the present invention, each R is independently H or $C_{1-20}$ alkyl or $C_{1-16}$ alkyl or $C_{1-12}$ alkyl or $C_{1-8}$ alkyl or $C_{1-4}$ alkyl.

According to a preferred embodiment of the present invention, $R^{21}$, $R^{22}$, $R^{24}$, $R^{25}$ are H and $R^{23}$ is H or halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N($C_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H. Preferably, $R^{11}$, $R^{12}$, $R^{13}$, $R^{14}$ and $R^{15}$ are as defined above. More preferably, $R^{11}$, $R^{12}$, $R^{13}$, $R^{14}$, $R^{15}$ are H and $R^{15}$ is as defined above.

According to a preferred embodiment of the present invention, $R^{21}$, $R^{24}$, $R^{25}$ are H and $R^{22}$ and $R^{23}$ form a cyclic structure with each other having from 5 to 8 C atoms, optionally interrupted by one or more oxygen atoms, —C(O)O—, —OC(O)—, sulfur atoms, —SO$_2$—, —NH—, —N($C_{1-12}$ alkyl)- and/or —C(O)N(H)—. Regarding the cyclic structure, it is among others preferred that $R^{22}$ and $R^{23}$ form a lactone, more preferably a delta-lactone with each other. Preferably, $R^{11}$, $R^{12}$, $R^{13}$, $R^{14}$ and $R^{15}$ are as defined above. More preferably, $R^{11}$, $R^{12}$, $R^{14}$, $R^{15}$ are H and $R^{15}$ is as defined above.

Typically, the electronic device comprises a dielectric material of the invention, which is essentially consisting of the copolymer comprising the structural units of formulae (I) and (II), i.e. contains this copolymer in an amount of more than 80% of its weight, preferably more than 90% of its weight, or even fully consists of the present copolymer.

Structural units of the formulae (I) and (II) typically make up the major part of the present copolymer, i.e. more than 50% of its weight. According to a preferred embodiment of the present invention, the copolymer further comprises at least one of the structural units selected from the group consisting of

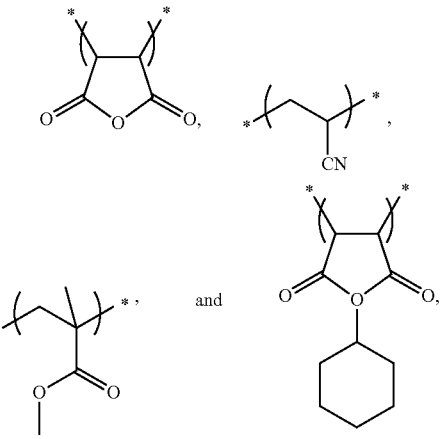

preferably either the structural unit

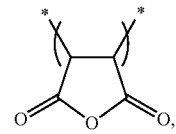

or the structural unit

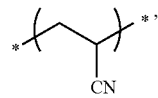

or the structural units

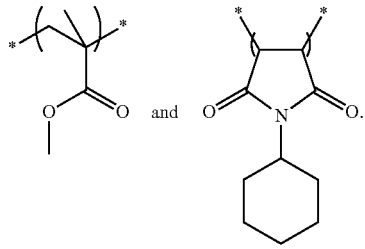

In an alternative embodiment of certain technical importance, however, the present copolymer may consist of about 10 to 50% of structural units of the formulae (I) and (II), besides structural units as shown above.

Preferably, $R^{11}$, $R^{12}$, $R^{13}$, $R^{14}$, $R^{15}$, $R^{21}$, $R^{22}$, $R^{23}$, $R^{24}$, $R^{25}$ are as defined above. More preferably, $R^{11}$, $R^{12}$, $R^{14}$, $R^{15}$ are H and $R^{13}$, $R^{21}$, $R^{22}$, $R^{23}$, $R^{24}$, $R^{25}$ are as defined above. More preferably, $R^{11}$, $R^{12}$, $R^{13}$, $R^{14}$, $R^{15}$, $R^{21}$, $R^{22}$, $R^{23}$, $R^{24}$, $R^{25}$ are as defined above.

It is further preferred that monomer (IIa) is selected from the group consisting of N-phenylmaleinimide, 1-[4-(acetoxy)phenyl]maleimide, 1-(4-bromophenyl)maleimide, 1-(4-iodophenyl)maleimide, 1-[4-(ethoxycarbonyl)phenyl]

maleimide, 1-[7-coumarine]maleimide, 1-[7-coumarine]maleimide, and mixtures of two or more thereof.

It is preferred that the copolymer of the present invention has a weight average molecular weight, as determined by gel permeation chromatography, of from 5,000 to 2,000,000 g/mol, preferably of from 10,000 to 1,000,000 g/mol. Preferred weight average molecular weights may be in the range of from 20,000 to 500,000 g/mol or from 25,000 to 200,000 g/mol or from 30,000 to 150,000 g/mol. Conceivable ranges are from 30,000 to 90,000 g/mol or from 60,000 to 120,000 g/mol or from 90,000 to 150,000 g/mol.

Preferably, the device comprising a dielectric material additionally comprises a layer comprising a semiconducting polymeric material, and wherein both the dielectric material comprising the monomer units of formulae (I) and (II) and the semiconducting polymeric material show orthogonal solubility in at least one pair of solvents or solvent mixtures.

The semiconducting layer comprises a semiconducting material. Examples of semiconducting materials are semiconducting materials having p-type conductivity (carrier: holes) and semiconducting materials having n-type conductivity (carrier: electrons).

Examples of semiconductors having n-type conductivity are perylenediimides, naphtalenediimides and fullerenes.

Semiconducting materials having p-type conductivity are preferred. Examples of semiconducting materials having p-type conductivity are molecules such as rubrene, tetracene, pentacene, 6,13-bis(triisopropylethynyl)pentacene, diindenoperylene, perylenediimide and tetracyanoquinodimethane, and polymers such as polythiophenes, in particular poly-3-hexylthiophene (P3HT), polyfluorene, polydiacetylene, poly-2,5-thienylene vinylene, poly-p-phenylene vinylene (PPV) and polymers comprising repeating units having a diketopyrrolopyrrole group (DPP polymers).

It is particularly preferred that the semiconducting polymeric material comprises units having a diketopyrrolopyrrole group (DPP polymer) and/or a thiophene group (hereinafter also referred to as "diketopyrrolopyrrole (DPP)-thiophene-polymer"). Examples of such DPP polymers and their synthesis are, for example, described in U.S. Pat. No. 6,451,459 B1, WO 2005/049695, WO 2008/000664, WO 2010/049321 (especially preferred: the compound of example 1 of WO 2010/049321), WO 2010/049323, WO 2010/108873, WO 2010/115767, WO 2010/136353, WO 2010/136352, and WO 2013/144856; see, for example, the passage from page 41, line 3, to page 52, line 1, of WO 2013/144856 A1, which is hereby incorporated by reference).

Preferably, the semiconducting material is applied as a solution in an organic solvent A on the layer of the transistor or on the substrate.

The organic solvent A can be any solvent or mixture of two or more solvents that can dissolve at least 0.1% by weight, preferably at least 0.5% by weight, more preferably, at least 1% by weight, more preferably, at least 4% by weight of the semiconducting material based on the weight of the solution of the semiconducting material.

The organic solvent A can be any solvent or mixture of two or more solvents that has a boiling point (at ambient pressure) of at most 180° C., preferably at most 150° C., more preferably at most 130° C.

Preferably, the organic solvent A is an aromatic hydrocarbon solvent selected from the group consisting of compounds of formulae (IIIa), (IIIb), (IIIc), and mixtures of two or more thereof,

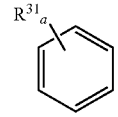

(IIIa)

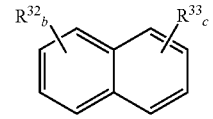

(IIIb)

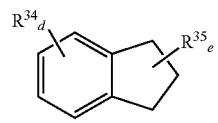

(IIIc)

wherein $R^{31}$, $R^{32}$, $R^{33}$, $R^{34}$ and $R^{35}$ are, independently from each other, halogen, linear or branched $C_{1-6}$ alkyl, $C_{2-6}$ alkenyl, $C_{5-6}$ cycloalkyl, a is 0, 1, 2 or 3,
b is 0, 1, 2 or 3,
c is 0, 1, 2 or 3,
d is 0, 1, 2 or 3,
e is 0, 1,2 or 3,
b+c is ≤3,
d+e is ≤3.

Preferably, aromatic hydrocarbon solvents of formula (IIIa) are selected from the group consisting of benzene, chlorobenzene, dichlorobenzene, toluene, xylene, mesitylene, ethylbenzene, 1,2-diethylbenzene, 1,3-diethylbenzene, 1,4-diethylbenzene, propylbenzene, isopropylbenzene, cymene, 2-phenylbutane, t-butylbenzene, amylbenzene, amyltoluene, diamylbenzene, styrene, vinyltoluene, alphamethylstyrene, cyclohexylbenzene, and mixtures of two or more thereof. More preferably, the aromatic hydrocarbon solvent of formula (IIIa) is selected from the group consisting of chlorobenzene, dichlorobenzene, toluene, xylene, mesitylene, and cyclohexylbenzene, and mixtures of two or more thereof.

Examples of aromatic hydrocarbon solvents of formula (IIIb) are naphthalene, 1-methyl-naphthalene, 1-ethylnaphthalene, 2-ethylnaphthalene, 1,4-dimethylnaphthalene, and mixtures of two or more thereof. Preferably, the aromatic hydrocarbon solvent of formula (IIIb) is 1-methyl-naphthalene.

Examples of aromatic hydrocarbon solvents of formula (IIIc) are indane, 1-methyl-indane, 2-methyl-indane, 4-methyl-indane, 5-methyl-indane, and mixtures of two or more thereof. It is preferred that the aromatic hydrocarbon solvent of formula (IIIc) is indane.

Preferably, the dielectric material of the present invention is applied as a solution in an organic solvent B on the layer of the transistor or on the substrate.

The organic solvent B can be any solvent or mixture of two or more solvents that can dissolve at least 0.5 by weight, preferably at least 5% by weight, more preferably, at least 8% by weight of the dielectric material based on the weight of the solution of the dielectric material.

As the organic solvent B, generally any solvent may be chosen which has a boiling point, at ambient pressure, in the range of from 80 to 250° C. Solvent B may be a mixture of two or more of such solvents. In a preferred process, every component of solvent B has a boiling point in the range of from 100 to 220° C., especially from 100 to 200° C.

Conceivable are also mixtures comprising a main solvent, contained in the mixture, for example, in an amount of at least 70% by weight, such as at least 80% by weight, at least 90% by weight, or at least 95% by weight, and having a boiling point in the range of from 120 to 180° C. such as from 130 to 170° C. or from 140 to 160° C., and further comprising and a minor solvent, contained in the mixture, for example, in an amount of at most 30% by weight, such as at most 20% by weight, at most 10% by weight, or at most 5% by weight, and having a boiling point in the range of at least 200° C. such as in the range of from 200 to 250° C.

Preferably, the organic solvent B is selected from the group consisting of N-methyl-pyrrolidone, $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures of two or more thereof.

Examples of $C_{1-4}$-alkyl-C(O)—$C_{1-4}$-alkyl are ethyl isopropyl ketone, methyl ethyl ketone and methyl isobutyl ketone.

Examples of $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, are ethyl acetate, butyl acetate, isobutyl acetate, (2-methoxy)ethyl acetate, (2-methoxy)propyl acetate and ethyl lactate.

An example of $C_{1-4}$-alkyl-O—$C_{1-4}$-alkylene-O—$C_{1-4}$-alkylene-O—$C_{1-4}$-alkyl is diethyleneglycoldimethylether.

More preferably, the organic solvent B is selected from the group consisting of $C_{4-8}$-cyclo-alkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof. Examples are methyl ethyl ketone, 1,4-dioxane, methyl-isobutyl ketone, butylacetate, 2-hexanone, 3-hexanone, 2-methoxy-1,3-dioxolane, Propylene glycol methyl ether acetate (PGMEA), ethyl lactate, DiGlyme, 5-methyl-3H-furan-2-one ("alpha-angelica lactone"), dipropylene glycol dimethyl ether (ProGlyde DMM), N-methyl-pyrrolidone (NMP), gamma-butyrolactone, acetophenone, isophorone, gamma-caprolactone, 1,2-propylene carbonate; blends of Propylene glycol methyl ether acetate (PGMEA, e.g. 95% and proyplene carbonate, e.g. 5%).

Most preferably, the organic solvent B is selected from the group consisting of $C_{5-6}$-cyclo-alkanone, $C_{1-4}$-alkanoic acid $C_{1-4}$-alkyl ester, and mixtures thereof. Even most preferably the organic solvent A is cyclopentanone or butyl acetate or mixtures thereof. In particular preferred organic solvents A are butyl acetate or mixtures of butyl acetate and cyclopentanone, wherein the weight ratio of butyl acetate/cyclopentanone is preferably at least from 99:1 to 20:80, more preferably from 99:1 to 25:75, more preferably from 99:1 to 30:70.

If the dielectric material is applied as a solution in an organic solvent B on the layer of the transistor or on the substrate, the dielectric material can be applied by any possible solution process, such as spin-coating, drop-casting or printing.

After applying the dielectric material as a solution in an organic solvent B on the layer of the transistor or on the substrate, a heat treatment at a temperature of at most 140° C., preferably below 140° C., for example at a temperature in the range of from 60 to 120° C., preferably at a temperature of at most 120° C., preferably below 120° C., for example in the range of from 60 to 110° C. can be performed.

It is preferred that the dielectric material comprised by the electronic device is present in the form of a layer and the layer thickness is from 50 nm to 2,000 nm, preferably from 100 nm to 1,000 nm.

Processes

As mentioned above, the present invention further relates to a process for the preparation of the electronic device of the present invention, said process comprising preparing the dielectric material comprising a copolymer comprising the structural units of formulae (I) and (II), by
(a) a free radical polymerization of at least monomer (Ia) and monomer (IIa), and/or
(b) a controlled radical polymerization of at least monomer (Ia) and monomer (IIa), and/or
(c) an imide forming reaction of a copolymer, comprising the structural units (I) and (IIb), and an amine-comprising monomer (IIc).

(a) Free Radical Polymerization of at Least Monomer (Ia) and Monomer (IIa)

Methods of free-radical polymerization known in the prior art may be used to prepare the copolymers of the present invention. Polymerization of the monomers can take place under a variety of conditions, including bulk polymerization, solution polymerization, usually in an organic solvent, preferably mineral oil. Preferably, a copolymer of formula (IV) is obtained.

For a solution polymerization, the starting reaction mixture preferably comprises a diluent, monomers (Ia) and (IIa), a polymerization initiator and optionally a chain transfer agent. Suitable polymerization initiators include initiators which disassociate upon heating to yield a free radical, e.g., peroxide compound, such as benzoyl peroxide, t-butyl peroxybenzoate, t-butyl peroxyoctoate and cumene hydroperoxide; or azo compound such as azoisobutyronitrile and 2,2'-azobis(2-methylbutanenitrile).

Suitable chain transfer agents include those conventional in the art such as mercaptanes and alcohols. For example, tridecyl mercaptan, n-dodecyl mercaptan and ethyl mercaptan may be used as chain transfer agents. The selection of the amount of chain transfer agent to be used is based on the desired molecular weight of the polymer being synthesized.

By way of example and without limitation, typically a reactor is charged with a monomer of formula (Ia), a radical initiator and a suitable solvent. A dropping funnel is charged with the monomer according to formula (Ia) and the monomer according to formula (IIa). The monomer of formula (Ia) in the reactor is heated until the radical reaction starts and the monomer according to formula (IIa) is slowly added from the dropping funnel. After the reaction, the mixture is poured into a suitable solvent such as methanol and the polymer is collected by filtration, washed with a suitable washing agent such as methanol, and dried.

(b) Controlled Free Radical Polymerization of at Least Monomer (Ia) and Monomer (IIa)

Alternatively, the copolymer in the dielectric material copolymer comprising the structural units of formulae (I) and (II) is obtained by a controlled free radical polymerization. According to methods known in the prior art, mediation of the controlled free radical procedure may be for example achieved by stable free radical polymerization (SFRP), reversible addition-fragmentation transfer polymerization (RAFT), or atom transfer radical polymerization (ATRP). Preferably, a copolymer of formula (IV) is obtained.

For a solution polymerization, the starting reaction mixture preferably comprises a diluent, monomers (Ia) and (IIa), a polymerization initiator and optionally a chain transfer agent.

By way of example and without limitation, typically a reactor is charged with a monomer of formula (Ia), a radical initiator and a suitable solvent. A dropping funnel is charged with the monomer according to formula (Ia) and the monomer according to formula (IIa). The monomer of formula (Ia) in the reactor is heated until the radical reaction starts and the monomer of formula (IIa) is slowly added from the dropping funnel. After the reaction, the mixture is poured into a suitable solvent such as methanol and the polymer is collected by filtration, washed with a suitable washing agent such as methanol, and dried.

(c) Imide Forming Reaction Between a Copolymer, Comprising the Structural Units (I) and (IIb), and an Amine Comprising Compound (IIc)

Alternatively, the copolymer in the dielectric material copolymer comprising the structural units of formulae (I) and (II) may be obtained by an imide forming reaction. Preferably, a copolymer of formula (IV) is obtained.

For the imide forming reaction, the starting reaction mixture preferably comprises a diluent, a copolymer which comprises the structural units (I) and (IIb), and an amine-comprising monomer (IIc).

Preferably, the dielectric material of the present invention comprises a copolymer of formula (IV),

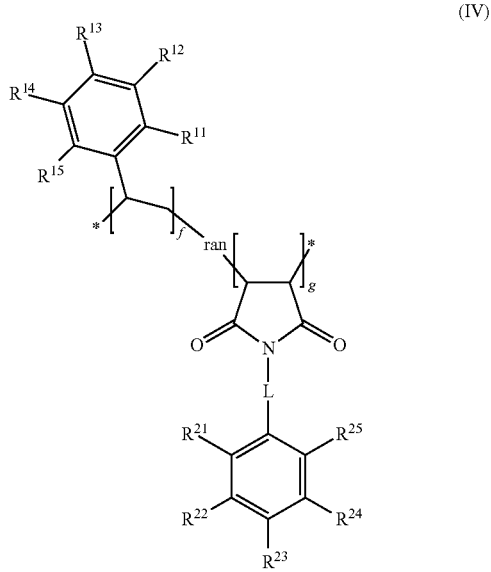

(IV)

wherein
f is in the range of from 1 to 20, preferably from 1 to 15, more preferably from 1 to 10, more preferably from 1 to 7, more preferably from 1 to 5, and g is in the range of from 1 to 20, preferably from 1 to 15, more preferably from 1 to 10, more preferably from 1 to 7, more preferably from 1 to 5, more preferably from 1 to 3, even more preferably 1.

The present invention further relates to the use of a copolymer as defined above as a dielectric material, typically as dielectric layer or encapsulation layer in printed electronic devices such as capacitors and organic field-effect transistors. Especially preferred is an electronic device of the invention, which comprises the copolymer defined above as a dielectric layer, where the dielectric layer stands in contact with a semiconductor layer.

The present invention is further illustrated by the following examples.

The diketopyrrolopyrrole (DPP)-thiophene-polymer used in the examples as organic semiconductor is the one described in example 1 of WO2010/049321, of the formula:

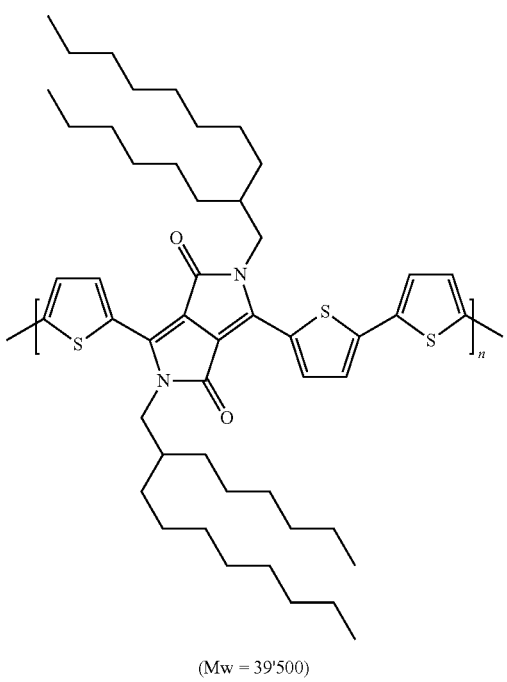

(Mw = 39'500)

EXAMPLE 1

Preparation of Dielectric Materials via a Free Radical Polymerization 1.1 Preparation of N-Phenylmaleic Imide Monomers of Formula (IIa)

N-phenylmaleic imide monomers of formula (IIa) (monomers (1a) to (1e)) were prepared according to the following general two-step reaction scheme and reaction procedure:

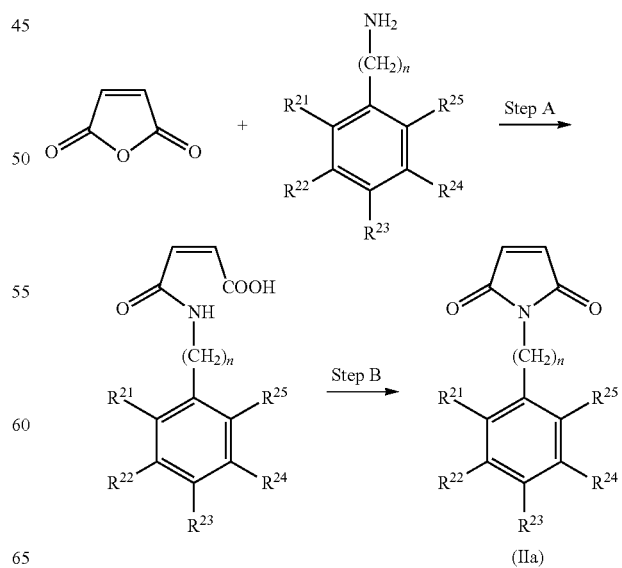

(IIa)

Step A: N-Substituted Maleamic Acid

Maleic anhydride (6.04 mmol) was dissolved in anhydrous $CH_2Cl_2$ (15 mL), and aniline or aniline derivative (5.49 mmol) was subsequently added. The mixture was stirred for 1 hour at room temperature (precipitation of the acid was observed after a few minutes). The pure solid N-substituted maleamic was obtained by filtration and washing with $CH_2Cl_2$.

Step B: Cyclisation to Imide

To a solution of N-phenyl maleamic acid (3 g, 14.8 mmol) obtained in step A in anhydrous tetrahydrofuran (60 mL) was added an equimolar amount of sodium acetate (1.14 g) and acetic anhydride (1.5 mL) and the mixture was stirred at 60° C. for 8 h, followed by evaporation of the solvent under vacuum. The residue was washed with an aqueous HCl-solution and water, and was dried.

According to these procedures, the following maleimides were synthesized:

N-Phenylmaleinimide (Ia), white solid. Yield: 95%. mp 301° C.

$^1H$ NMR (400 MHz, DMSO-$d_6$): delta=13.12 (s, 1H, COOH), 10.38 (s, 1H, NH), 7.62 (m, 2H, Ar), 7.33 (m, 2H, Ar), 7.09 (m, 1H, Ar), 6.48 (d, $^3J_{H,H}$=12.2 Hz, 1H, NCOCH), 6.31 (d, $^3J_{H,H}$=12.2 Hz, 1H) ppm.

$^{13}C$ NMR (100 MHz, DMSO-$d_6$): delta=166.7, 163.1, 138.4, 131.6, 130.3, 128.7, 123.8, 119.4 ppm 1-[4-(Acetoxy)phenyl]maleimide (Ib), yellow crystalline solid. Yield: 87%. mp 260-262° C.

$^1H$ NMR (DMSO-$d_6$, 270 MHz) delta=2.73 (4H, s), 7.01 (2H, d, J 8.6), 6.82 (2H, d, J 8.6) ppm. $^{13}C$ NMR (67.5 MHz) d (ppm), 177.76, 157.65, 128.83, 135.84, 28.87 ppm.

1-(4-Bromophenyl)maleimide (Ic), yellow crystalline solid. Yield: 87%. mp 128-130° C.

$^1H$ NMR (CDCl$_3$) delta=6.86 (s, 2H), 7.24 (d, 2H), 7.80 (d, 2H) ppm.

$^{13}C$ NMR (CDCl$_3$) delta=121.5, 127.4, 130.3, 132.2, 134.3, 169.1 ppm.

1-(4-Iodophenyl)maleimide (Id), yellow crystalline solid. Yield: 90%. m.p. 145-147° C.

$^1H$ NMR (CDCl$_3$) delta=6.85 (s, 2H), 7.13 (d, 2H), 7.79 (d, 2H) ppm.

$^{13}C$ NMR (CDCl$_3$) delta=127.6, 131.1, 134.3, 138.3, 169.0

1-[4-(Ethoxycarbonyl)phenyl]maleimide (Ie). Colorless solid, yield 93% m.p. 114.5-115.5° C.

$^1H$ NMR (CDCl$_3$) delta=8.10-8.20 (m, 2H), 7.45-7.55 (m, 2H), 6.89 (s, 2H), 1.40 (t, J=7.1 Hz, 3H) ppm.

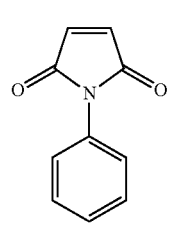

(Ia)

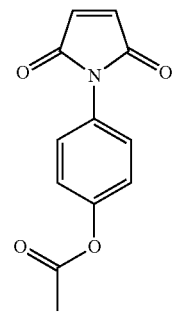

(Ib)

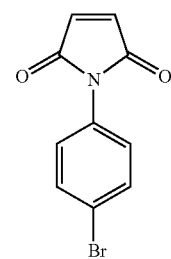

(Ic)

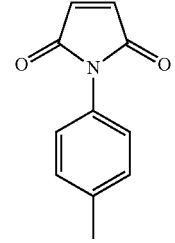

(Id)

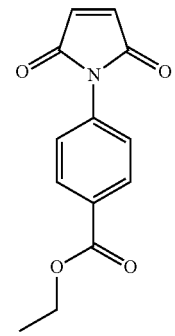

(Ie)

1.2 Preparation of a Copolymer Comprising Structural Units of Formulae (Ia) and (IIa)

Specifically, styrene-N-phenyl-maleimide-copolymer (2a) is prepared by charging a reactor with 6.5 g (0.06 mol) styrene, 0.4 g t-butylperoxyoctate as initiator, n-dodecyl-mercaptan as charge transfer agent and 30 mL MEK. A dropping funnel is charged with 35.7 g (0.342 mol) styrene and 7.8 g (0.045 mol) N-phenyl-maleinimide (1a). The reactor is heated to 85° C. and the styrene-maleimide mixture is slowly (about 5 h) dropped into the reaction mixture. The mixture is cooled and poured into 500 mL cold methanol. The precipitated copolymer is isolated by filtration, washed with methanol and dried in a vacuum oven. The reaction affords 17.9 g copolymer as a white powder with a styrene:maleimide ratio of 7:3, MW 100,000 g/mol and $T_g$ (glass transition temperature)=163° C.

1.3 Following the Method Described Under 1.2, Copolymer (2b)

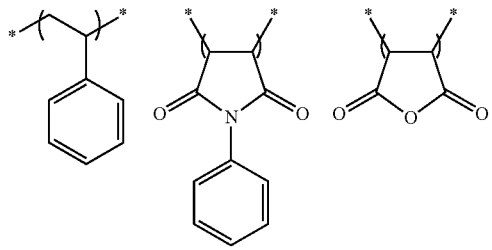

is prepared using the monomers 49% b.w. of styrene, 42% b.w. of N-phenyl-maleinimide, and 9% b.w. of maleic anhydride: Mw 109000; Polydispersity (PDI) 2.4; Tg 201° C.

1.4 Following the Method Described Under 1.2, Copolymer (2c)

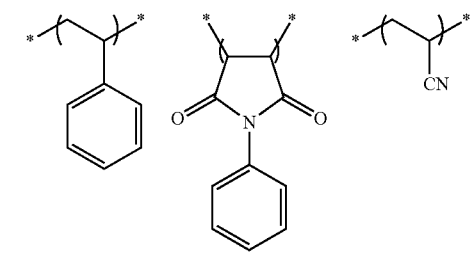

is prepared using the monomers 49% b.w. of styrene, 43% b.w. of N-phenyl-maleinimide, and 8 % b.w. of acrylonitrile: Mw 122000; Polydispersity (PDI) 2.5; Tg 172° C.

1.5 Following the Method Described Under 1.2, Copolymer (2d)

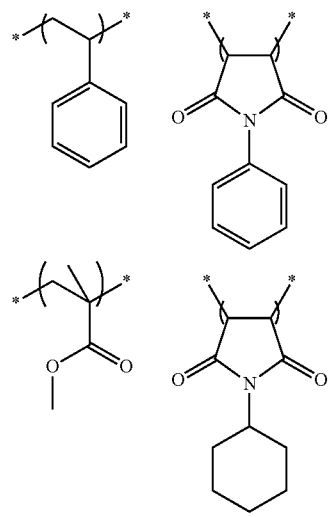

is prepared using the monomers 3% b.w. of styrene, 17% b.w. of N-phenyl-maleinimide, 78% b.w. of methyl-methacrylate and 2% b.w. of N-cyclohexyl-maleimide: Mw 137000; Polydispersity (PDI) 3.0; Tg 139° C.

EXAMPLE 2

Preparation of a Dielectric Material Via an Imidization Reaction

Specifically, styrene-N-benzyl-maleinimide-copolymer (3a) is prepared by stirring 7.8 g copolymer based on styrene and maleic anhydride (SMA 2000 obtained from Cray Valley), 2.73 g benzyl amine (107 g/mol, 0.0255 mol) and 15.00 g MPA (1-methoxy-2-propyl acetate) for 1 hour at room temperature, then for 1 hour at 60° C., then for 1 hour at 90° C., then for 1 hour at 130° C., and then at 160° C. until the acid number is lower than 50 mg KOH/g (2*26000/413=270 mg KOH/g, ring-closing degree of 60%). The precipitated copolymer is isolated by filtration, washed with methanol and dried in a vacuum oven. An amine number of 10 mg KOH/g and a $T_g$=113° C. is determined for the copolymer.

EXAMPLE 3

Preparation of Capacitor Comprising a Layer of Copolymer (3a)

A 20% (weight/weight) solution of copolymer (3a) in 1-methoxy-2-propyl acetate (weight/weight) is filtered through a 0.45 micrometer filter and applied on a clean glass substrate with indium tin oxide (ITO) electrodes by spin coating (3,600 rpm, 30 seconds). The wet film is pre-baked at 100° C. for 10 minutes on a hot plate to obtain a 530 nm thick layer. Gold electrodes (area=3 mm$^2$) are then vacuum-deposited through a shadow mask on the copolymer (3a) layer at <1×10$^{-6}$ Torr (1.3×10$^{-4}$ Pa).

The capacitor thus obtained is characterized in the following way: The relative permittivity (epsilon)$_r$ and tg(delta)=(epsilon)$_r$" are deduced from the complex capacity measured with a LCR meter Agilent 4284A (signal amplitude 1 V). Current/Voltage (I/V) curves are obtained with a semiconductor parameter analyser Agilent 4155C. The breakdown voltage is the voltage Ed where the current reaches a value of 1 microampere. The volume resistivity rho is calculated from the resistance, sample thickness and electrode surface.

| Polymer | rho [Ohm * cm] | (epsilon)$_r$ 20 Hz | (epsilon)$_r$ 100 kHz | (epsilon)$_r$" 20 Hz | (epsilon)$_r$" 100 kHz | Ed [V/μm] |
|---|---|---|---|---|---|---|
| 20 wt % (3a) | 2.47E+15 | 2.63 | 2.51 | 3.21E−02 | 4.07E−03 | >165 |

EXAMPLE 4

Preparation of a Top-Gate, Bottom Contact (TGBC) Field Effect Transistor Comprising a Gate Dielectric Layer of Compound (3a)

Gold is sputtered onto poly(ethylene terephthalate) (PET) foil to form an approximately 40 nm thick film and then source/drain electrodes (channel length: 10 micrometer; channel width: 10 mm) are structured by photolithography process. A 0.75% (weight/weight) solution of a diketopyrrolopyrrole (DPP)-thiophene-polymer in toluene is filtered through a 0.45 micrometer polytetrafluoroethylene (PTFE) filter and then applied by spin coating (1,300 rpm, 10,000 rpm/s, 15 seconds). The wet organic semi-conducting polymer layer is dried at 100° C. on a hot plate for 30 seconds. A 20% (weight/weight) solution of copolymer (3a) in 1-methoxy-2-propyl acetate (weight/weight) is filtered through a 0.45 micrometer filter and then applied by spin coating (3,000 rpm, 60 seconds). The wet dielectric film is pre-baked at 100° C. for 10 minutes on a hot plate to obtain a 556 nm thick layer. Gate electrodes of gold (thickness approximately 120 nm) are evaporated through a shadow mask on the copolymer (3a) layer. The whole process is performed without a protective atmosphere.

Measurement of the characteristics of the top gate, bottom contact (TGBC) field effect transistors are measured with a Keithley 2612A semiconductor parameter analyser. The drain current $I_{ds}$ in relation to the gate voltage $V_{gs}$ (transfer curve) for the top-gate, bottom-contact (TGBC) field effect transistor comprising a copolymer (3a) gate dielectric at a source voltage $V_{ds}$ of −1V (squares), respectively, −20V (triangles) is shown in FIG. 1.

Figure 2:
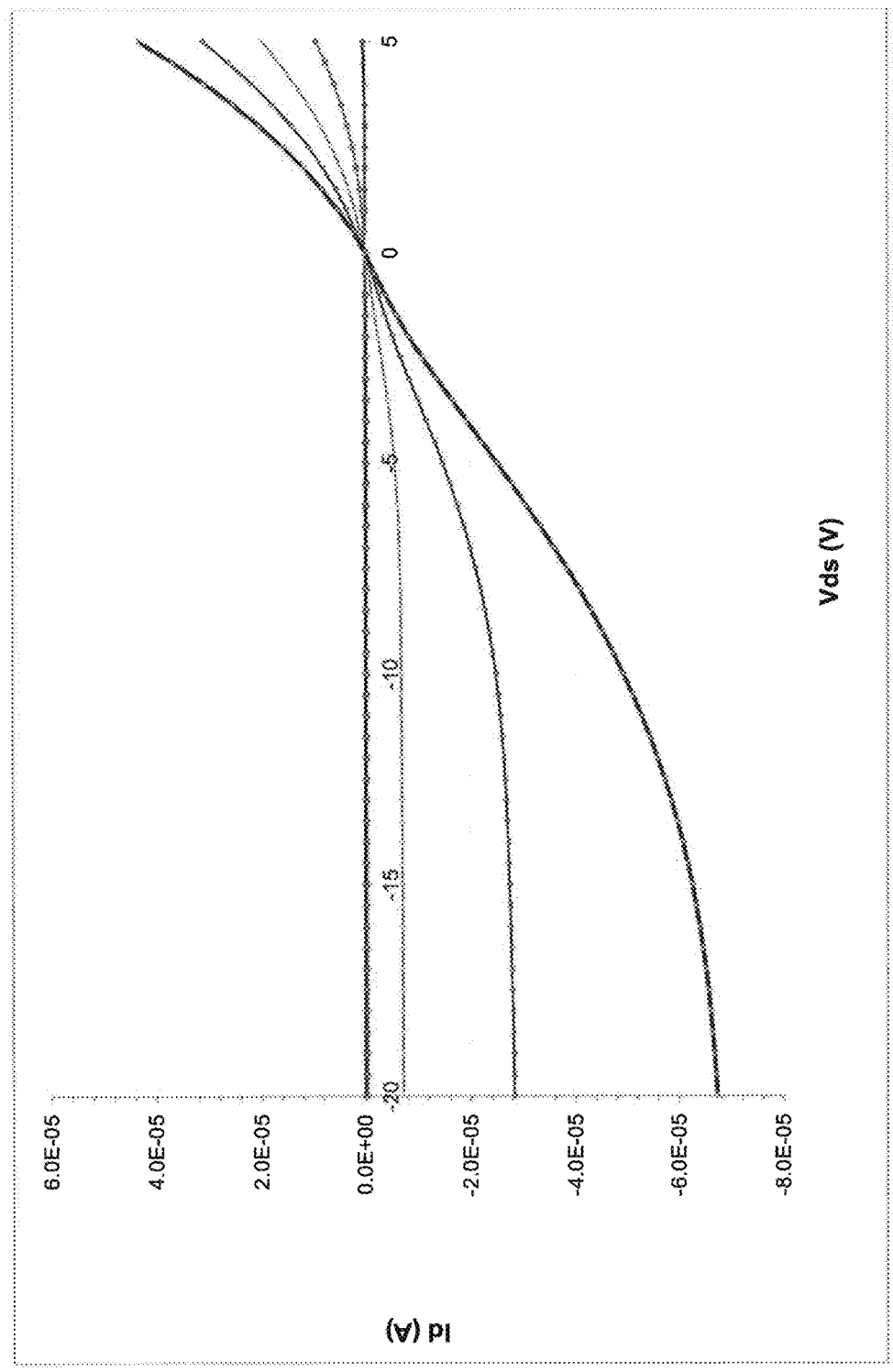
FIG. 2 shows the drain current $I_{ds}$ in relation to the drain voltage $V_{ds}$ (output curve) for a top-gate bottom-contact (TGBC) field effect transistor comprising copolymer (3a) at a gate voltage $V_{gs}$ of 0 V (stars), −5 V (squares), −10 V (lozenges), −15 V (triangles) and −20 V (circles), respectively (see Example 4 of the present invention).

The top-gate, bottom-contact (TGBC) field effect transistor comprising copolymer (3a) shows a mobility of 0.23 $cm^2/Vs$ (calculated for the saturation regime) and an Ion/Ioff ration of 7.1 E+4. The drain current $I_{ds}$ in relation to the drain voltage $V_{ds}$ (output curve) for the top-gate, bottom-contact (TGBC) field effect transistor comprising copolymer (3a) at a gate voltage $V_{gs}$ of 0 V (stars), −5 V (squares), −10 V (lozenges), −15 V (triangles) and −20 V (circles) is shown in FIG. 2.

EXAMPLE 5

Preparation of Capacitor Comprising a Layer of Polymer (2b)

A 5% (weight/weight) solution of Polymer (2b) in 2-methoxy-1,3-dioxolane/2-butanone/cyclohexanone 45/45/10 (weight/weight) is filtered through a 0.45 micrometer filter and applied on a clean glass substrate with indium tin oxide (ITO) electrodes by spin coating (1,100 rpm, 30 seconds). The wet film is pre-baked at 100° C. for 10 minutes on a hot plate to obtain a 530 nm thick layer. Gold electrodes (area=3 $mm^2$) are then vacuum-deposited through a shadow mask on the Polymer 2b layer at <1×10$^{-6}$ Torr (1.3×10$^{-4}$ Pa).

The capacitor thus obtained is characterized in the following way: the relative permittivity (epsilon)r and tg(delta)=(epsilon)r" are deduced from the complex capacity measured with a LCR meter Agilent 4284A (signal amplitude 1 V). Current/Voltage (I/V) curves are obtained with a semiconductor parameter analyser Agilent 4155C. The breakdown voltage is the voltage Ed where the current reaches a value of 1 microampere. The volume resistivity rho is calculated from the resistance, sample thickness and electrode surface.

| Polymer | rho [Ohm * cm] | (epsilon)r 20 Hz | (epsilon)r 100 kHz | (epsilon)r" 20 Hz | (epsilon)r" 100 kHz | Ed [V/μm] |
|---|---|---|---|---|---|---|
| 5 wt % Polymer (2b) | 3.66E+15 | 3.04 | 2.96 | 2.45E−02 | 2.06E−02 | >226 |

EXAMPLE 6

Preparation of a Top-Gate, Bottom Contact (TGBC) Field Effect Transistor Comprising a Gate Dielectric Layer of Polymer (2b)

Gold is sputtered onto poly(ethylene terephthalate) (PET) foil to form an approximately 40 nm thick film and then source/drain electrodes (channel length: 10 micrometer; channel width: 10 mm) are structured by photolithography process. A 0.75% (weight/weight) solution of a diketopyrrolopyrrole (DPP)-thiophene-polymer in toluene is filtered through a 0.45 micrometer polytetrafluoroethylene (PTFE) filter and then applied by spin coating (1,300 rpm, 10,000 rpm/s, 15 seconds). The wet organic semi-conducting polymer layer is dried at 100° C. on a hot plate for 30 seconds. A 5% (weight/weight) solution of copolymer (2b) in 2-Methoxy-1,3-dioxolane/2-Butanone 50/50 (weight/weight) is filtered through a 0.45 micrometer filter and then applied by spin coating (1,500 rpm, 60 seconds). The wet dielectric film is pre-baked at 100° C. for 10 minutes on a hot plate to obtain a 540 nm thick layer. Gate electrodes of gold (thickness approximately 120 nm) are evaporated through a shadow mask on the copolymer (2b) layer. The whole process is performed without a protective atmosphere.

Measurement of the characteristics of 3 top gate, bottom contact (TGBC) field effect transistors thus prepared are measured with a Keithley 2612A semiconductor parameter analyser. The drain current Ids in relation to the gate voltage Vgs (transfer curve) for the top-gate, bottom-contact (TGBC) field effect transistors comprising a copolymer (2b) gate dielectric at a source voltage Vds of −1V (squares), respectively, −20V (triangles) is shown in FIG. 3.

The top-gate, bottom-contact (TGBC) field effect transistor comprising copolymer (2b) shows a mobility of 0.39 cm2/Vs (calculated for the saturation regime) and an Ion/Ioff ratio of 1.5 E+5.

The drain current Ids in relation to the drain voltage Vds (output curve) for the top-gate, bottom-contact (TGBC) field effect transistor comprising copolymer (2b) at a gate voltage Vgs of 0 V (stars), −5 V (squares), −10 V (lozenges), −15 V (triangles) and −20 V (circles) is shown in FIG. 4.

EXAMPLE 7

Preparation of Capacitor Comprising a Layer of Polymer (2c)

A 6% (weight/weight) solution of Polymer (2c) in 2-Methoxy-1,3-dioxolane/2-Butanone/Cyclohexanone 45/45/10 (weight/weight) is filtered through a 0.45 micrometer filter and applied on a clean glass substrate with indium tin oxide (ITO) electrodes by spin coating (2,500 rpm, 30 seconds). The wet film is pre-baked at 100° C. for 10 minutes on a hot plate to obtain a 540 nm thick layer. Gold electrodes (area=3 $mm^2$) are then vacuum-deposited through a shadow mask on the Polymer (2c) layer at <1×10$^{-6}$ Torr (1.3×10$^{-4}$ Pa).

The capacitor thus obtained was characterized in the following way: the relative permittivity (epsilon)r and tg(delta)=(epsilon)r" are deduced from the complex capacity measured with a LCR meter Agilent 4284A (signal amplitude 1 V). Current/Voltage (I/V) curves are obtained with a semiconductor parameter analyser Agilent 4155C. The breakdown voltage is the voltage Ed where the current reaches a value of 1 microampere. The volume resistivity rho is calculated from the resistance, sample thickness and electrode surface.

| Polymer | rho [Ohm * cm] | (epsilon)$_r$ 20 Hz | (epsilon)$_r$ 100 kHz | (epsilon)$_r$" 20 Hz | (epsilon)$_r$" 100 kHz | Ed [V/μm] |
|---|---|---|---|---|---|---|
| 6 wt % Polymer (2c) | 2.03E+15 | 3.38 | 3.17 | 5.33E−02 | 2.26E−02 | >195 |

EXAMPLE 8

Preparation of a Top-Gate, Bottom Contact (TGBC) Field Effect Transistor Comprising a Gate Dielectric Layer of Polymer (2c)

Gold is sputtered onto poly(ethylene terephthalate) (PET) foil to form an approximately 40 nm thick film and then source/drain electrodes (channel length: 10 micrometer; channel width: 10 mm) are structured by photolithography process. A 0.75% (weight/weight) solution of a diketopyrrolopyrrole (DPP)-thiophene-polymer in toluene is filtered through a 0.45 micrometer polytetrafluoroethylene (PTFE) filter and then applied by spin coating (1,300 rpm, 10,000 rpm/s, 15 seconds). The wet organic semi-conducting polymer layer is dried at 100° C. on a hot plate for 30 seconds. A 5% (weight/weight) solution of copolymer (2c) in 2-Methoxy-1,3-dioxolane/2-butanone/cyclohexanone 45/45/10 (weight/weight) is filtered through a 0.45 micrometer filter and then applied by spin coating (2,000 rpm, 60 seconds). The wet dielectric film is pre-baked at 100° C. for 10 minutes on a hot plate to obtain a 570 nm thick layer. Gate electrodes of gold (thickness approximately 120 nm) are evaporated through a shadow mask on the copolymer (2c) layer. The whole process is performed without a protective atmosphere.

Measurement of the characteristics of 3 top gate, bottom contact (TGBC) field effect transistors thus prepared are measured with a Keithley 2612A semiconductor parameter analyser. The drain current Ids in relation to the gate voltage Vgs (transfer curve) for the top-gate, bottom-contact (TGBC) field effect transistors comprising a copolymer (2c) gate dielectric at a source voltage Vds of −1V (squares), respectively, −20V (triangles) is shown in FIG. 5.

The top-gate, bottom-contact (TGBC) field effect transistor comprising copolymer (2c) shows a mobility of 0.18 cm2/Vs (calculated for the saturation regime) and an Ion/Ioff ratio of 1.1 E+5.

The drain current Ids in relation to the drain voltage Vds (output curve) for the top-gate, bottom-contact (TGBC) field effect transistor comprising copolymer (2c) at a gate voltage Vgs of 0 V (stars), −5 V (squares), −10 V (lozenges), −15 V (triangles) and −20 V (circles) is shown in FIG. 6.

EXAMPLE 9

Preparation of Capacitor Comprising a Layer of Polymer (2d)

A 8% (weight/weight) solution of Polymer (2d) in 1-Methoxy-2-propyl acetate is filtered through a 0.45 micrometer filter and applied on a clean glass substrate with indium tin oxide (ITO) electrodes by spin coating (1,400 rpm, 30 seconds). The wet film is pre-baked at 100° C. for 10 minutes on a hot plate to obtain a 530 nm thick layer. Gold electrodes (area=3 mm2) are then vacuum-deposited through a shadow mask on the Polymer (2d) layer at <1×10−6 Torr (1.3×10−4 Pa).

The capacitor thus obtained is characterized in the following way: the relative permittivity (epsilon)r and tg (delta)=(epsilon)r" are deduced from the complex capacity measured with a LCR meter Agilent 4284A (signal amplitude 1 V). Current/Voltage (I/V) curves are obtained with a semiconductor parameter analyser Agilent 4155C. The breakdown voltage is the voltage Ed where the current reaches a value of 1 microampere. The volume resistivity rho is calculated from the resistance, sample thickness and electrode surface.

| Polymer | rho [Ohm * cm] | (epsilon)$_r$ 20 Hz | (epsilon)$_r$ 100 kHz | (epsilon)$_r$" 20 Hz | (epsilon)$_r$" 100 kHz | Ed [V/μm] |
|---|---|---|---|---|---|---|
| 8 wt % Polymer (2d) | 2.07E+15 | 3.96 | 3.20 | 1.80E−01 | 3.80E−02 | >189 |

EXAMPLE 10

Preparation of a Top-Gate, Bottom Contact (TGBC) Field Effect Transistor Comprising a Gate Dielectric Layer of Polymer (2d)

Gold is sputtered onto poly(ethylene terephthalate) (PET) foil to form an approximately 40 nm thick film and then source/drain electrodes (channel length: 10 micrometer; channel width: 10 mm) are structured by photolithography process. A 0.75% (weight/weight) solution of a diketopyrrolopyrrole (DPP)-thiophene-polymer in toluene is filtered through a 0.45 micrometer polytetrafluoroethylene (PTFE) filter and then applied by spin coating (1,300 rpm, 10,000 rpm/s, 15 seconds). The wet organic semi-conducting polymer layer is dried at 100° C. on a hot plate for 30 seconds. A 8% (weight/weight) solution of copolymer (2d) in 1-Methoxy-2-propyl acetate is filtered through a 0.45 micrometer filter and then applied by spin coating (1,400 rpm, 60 seconds). The wet dielectric film is pre-baked at 100° C. for 10 minutes on a hot plate to obtain a 515 nm thick layer. Gate electrodes of gold (thickness approximately 120 nm) are evaporated through a shadow mask on the copolymer (2d) layer. The whole process is performed without a protective atmosphere.

Characteristics of 3 top gate, bottom contact (TGBC) field effect transistors thus prepared are measured with a Keithley 2612A semiconductor parameter analyser. The drain current Ids in relation to the gate voltage Vgs (transfer curve) for the top-gate, bottom-contact (TGBC) field effect transistors comprising a copolymer (2d) gate dielectric at a source voltage Vds of −1V (squares), respectively, −20V (triangles) is shown in FIG. 7.

The top-gate, bottom-contact (TGBC) field effect transistor comprising copolymer (2d) shows a mobility of 0.17 cm2/Vs (calculated for the saturation regime) and an Ion/Ioff ratio of 9.7 E+4.

The drain current Ids in relation to the drain voltage Vds (output curve) for the top-gate, bottom-contact (TGBC) field effect transistor comprising copolymer (2d) at a gate voltage Vgs of 0 V (stars), −5 V (squares), −10 V (lozenges), −15 V (triangles) and −20 V (circles) is shown in FIG. 8.

The invention claimed is:
1. An electronic device comprising a dielectric material, which dielectric material comprises a copolymer comprising the structural units of formulae (I) and (II)

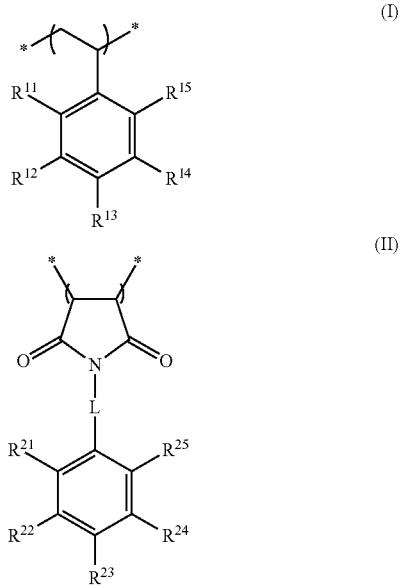

wherein $R^{11}$, $R^{12}$, $R^{13}$, $R^{14}$ and $R^{15}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H, and $R^{21}$, $R^{22}$, $R^{23}$, $R^{24}$ and $R^{25}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl,
each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H,
or wherein $R^{21}$ and $R^{22}$, or $R^{22}$ and $R^{23}$, form a cyclic structure with each other having from 5 to 8 C atoms, optionally interrupted by one or more oxygen atoms, —C(O)O—, —OC(O)—, sulfur atoms, —SO$_2$—, —NH—, —N(C$_{1-12}$ alkyl)- and/or —C(O)N(H)—, and $R^{23}$ and $R^{24}$ and $R^{25}$, or $R^{21}$ and $R^{24}$ and $R^{25}$, are as defined above, wherein L is a either a direct bond, or $C_{1-4}$ alkylene which is either uninterrupted or interrupted by one or more oxygen atoms, and wherein each R is independently H or $C_{1-24}$ alkyl;
further comprising a layer comprising a semiconducting polymeric material, wherein both the dielectric material comprising the structural units of formulae (I) and (II) and the semiconducting polymeric material exhibit orthogonal solubility in at least one pair of solvents or solvent mixtures.

2. The electronic device of claim 1, wherein the device is selected from a capacitor, a transistor, an organic field effect transistor, or a device comprising said capacitor, said transistor, or said organic field effect transistor; where the dielectric layer is in contact with a semiconductor layer.

3. The electronic device of claim 1, wherein the structural units of formulae (I) and (II) are present in a mole ratio of (I) to (II) in a range of from 20:1 to 1:5.

4. The electronic device of claim 1, wherein $R^{21}$, $R^{22}$, $R^{24}$, $R^{14}$, $R^{25}$ are H and wherein $R^{23}$ is H or halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N(C$_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H.

5. The electronic device of claim 1, wherein $R^{21}$, $R^{24}$, $R^{25}$ are H and wherein $R^{22}$ and $R^{23}$ form a cyclic structure with each other having from 5 to 8 C atoms, optionally interrupted by one or more oxygen atoms, —C(O)O——OC (O)—, sulfur atoms, —SO$_2$—, —NH—, —N(C$_{1-12}$ alkyl)- and/or —C(O)N(H)—.

6. The electronic device of claim 5, wherein $R^{22}$ and $R^{23}$ together form a delta-lactone.

7. The electronic device of claim 1, wherein $R^{11}$, $R^{12}$, $R^{14}$ and $R^{15}$ are H.

8. The electronic device of claim 1, the copolymer further comprising at least one structural unit selected from the group consisting of

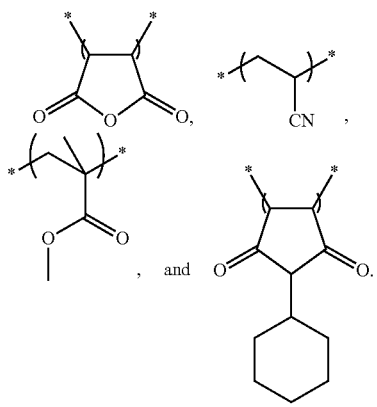

9. The electronic device of claim 1, the copolymer further comprising structural units of

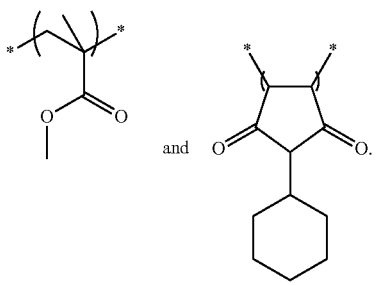

10. The electronic device of claim 8, wherein $R^{11}$, $R^{12}$, $R^{13}$, $R^{14}$, $R^{15}$, $R^{21}$, $R^{22}$, $R^{23}$, $R^{24}$, $R^{25}$ are H.

11. The electronic device of claim 1, wherein the copolymer has a weight average molecular weight, as determined by gel permeation chromatography, of from 5,000 to 2,000,000 g/mol.

12. The electronic device of claim 1, wherein the semiconducting polymeric material comprises structural units having a diketopyrrolopyrrole group (DPP polymer) and/or a thiophene group.

13. The electronic device of claim 1, wherein the dielectric material is present in the form of a layer and the layer thickness is from 50 to 2000 nm.

14. A process for the preparation of an electronic device according to claim 3, said process comprising preparing a dielectric material comprising a copolymer comprising the structural units of formulae (I) and (II)

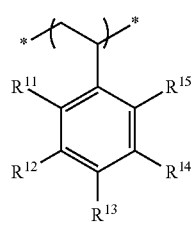 (I)

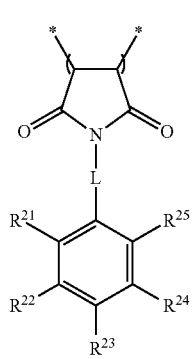 (II)

by
a) radical mediated polymerization of at least monomer (Ia) and monomer (IIa); or

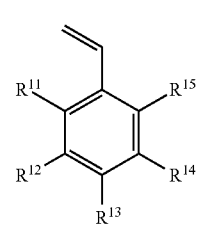 (Ia)

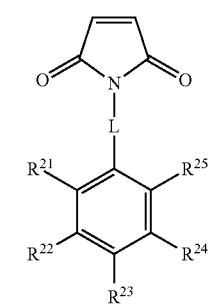 (IIa)

b) an imide forming reaction of a copolymer, comprising the structural unit (I), and the structural unit (IIb) and an amine compound (IIc)

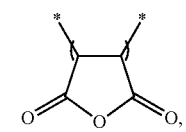 (IIb)

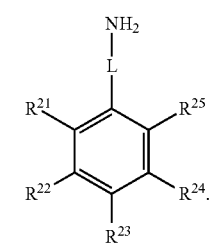 (IIc)

15. A dielectric layer, or encapsulation layer, in a printed electronic device selected from a capacitor or an organic field-effect transistor, the dielectric layer or encapsulation layer comprising a copolymer that includes structural units of formulae (I) and (II)

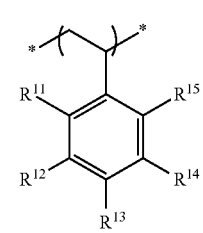 (I)

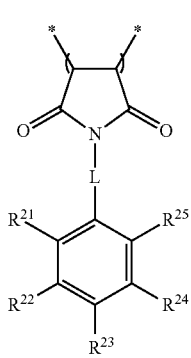

(II)

wherein $R^{11}$, $R^{12}$, $R^{13}$, $R^{14}$ and $R^{15}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N($C_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H, and $R^{21}$, $R^{22}$, $R^{23}$, $R^{24}$ and $R^{25}$ are, independently from each other, H, halogen, linear or branched $C_{1-24}$ alkyl, formyl, $C_{1-24}$ alkyl-carbonyl, $C_{2-24}$ alkenyl, $C_{2-10}$ alkynyl, $C_{2-24}$ alkenyl-carbonyl, $C_{3-12}$ cycloalkyl, $C_{3-12}$ cycloalkenyl, $C_{6-12}$ aryl, $C_{7-25}$ arylalkyl or $C_{7-25}$ alkylaryl, each of which carbon atom chains is either uninterrupted or interrupted by one or more oxygen atoms, —C(O)O—, —OC(O)—, —S—, —SO$_2$—, —N(H)—, —N($C_{1-12}$ alkyl)- and/or —C(O)N(H)—, and each of which is unsubstituted or substituted one or more times by one or more moieties —OR, —NH$_2$, —N(H)R, —NR$_2$, —N$_3$, -halogen and/or —SO$_3$H, or wherein $R^{21}$ and $R^{22}$, or $R^{22}$ and $R^{23}$, form a cyclic structure with each other having from 5 to 8 C atoms, optionally interrupted by one or more oxygen atoms, —C(O)O—, —OC(O)—, sulfur atoms, —SO$_2$—, —NH—, —N($C_{1-12}$ alkyl)- and/or —C(O)N(H)—, and $R^{23}$ and $R^{24}$ and $R^{25}$, or $R^{21}$ and $R^{24}$ and $R^{25}$, are as defined above, wherein L is either a direct bond, or $C_{1-4}$ alkylene which is either uninterrupted or interrupted by one or more oxygen atoms, and wherein each R is independently H or $C_{1-24}$ alkyl, wherein $R^{21}$, $R^{24}$, $R^{25}$ are H and wherein $R^{22}$ and $R^{23}$ form a cyclic structure with each other having from 5 to 8 C atoms, optionally interrupted by one or more oxygen atoms, —C(O)O—, —OC(O)—, sulfur atoms, —SO$_2$—, —NH—, —N($C_{1-12}$ alkyl)- and/or —C(O)N(H)—;

further comprising a layer comprising a semiconducting polymeric material, wherein both the dielectric material comprising the structural units of formulae (I) and (II) and the semiconducting polymeric material exhibit orthogonal solubility in at least one pair of solvents or solvent mixtures.

16. The dielectric layer, or encapsulation layer, of claim 15, wherein $R^{11}$, $R^{12}$, $R^{13}$, $R^{14}$, $R^{15}$, $R^{21}$, $R^{22}$, $R^{23}$ and $R^{24}$, $R^{25}$ are H; the copolymer further comprising at least one structural unit selected from the group consisting of

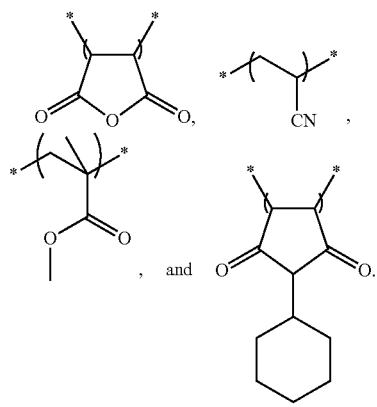

* * * * *